(12) United States Patent
Oda

(10) Patent No.: US 7,635,269 B2
(45) Date of Patent: Dec. 22, 2009

(54) SOCKET FOR ELECTRICAL PARTS

(75) Inventor: Takahiro Oda, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 11/393,895

(22) Filed: Mar. 31, 2006

(65) Prior Publication Data
US 2006/0228914 A1 Oct. 12, 2006

(30) Foreign Application Priority Data
Apr. 6, 2005 (JP) ............... 2005-110254

(51) Int. Cl.
*H01R 12/00* (2006.01)

(52) U.S. Cl. ........................ 439/71; 439/86

(58) Field of Classification Search .............. 439/66, 439/71, 73, 86
See application file for complete search history.

(56) References Cited

U.S. PATENT DOCUMENTS

| 4,194,800 | A | * | 3/1980 | Chow | 439/71 |
| 4,655,519 | A | * | 4/1987 | Evans et al. | 439/74 |
| 5,127,837 | A | * | 7/1992 | Shah et al. | 439/71 |
| 5,282,111 | A | * | 1/1994 | Hopfer | 361/704 |
| 5,344,334 | A | * | 9/1994 | Laub et al. | 439/331 |
| 5,395,254 | A | * | 3/1995 | Mogi | 439/70 |
| 5,791,914 | A | * | 8/1998 | Loranger et al. | 439/71 |
| 6,464,511 | B1 | | 10/2002 | Watanabe et al. | 439/66 |
| 6,776,624 | B2 | * | 8/2004 | Suematsu | 439/71 |
| 6,929,486 | B2 | * | 8/2005 | Shimada | 439/70 |
| 2004/0009682 | A1 | * | 1/2004 | Suzuki et al. | 439/73 |

FOREIGN PATENT DOCUMENTS

WO  WO 01/37381  5/2001

* cited by examiner

*Primary Examiner*—Tho D Ta
*Assistant Examiner*—Travis Chambers
(74) *Attorney, Agent, or Firm*—Staas & Halsey

(57) ABSTRACT

A socket for an electrical part comprises a socket body to be mounted on a wiring board and a contact unit mounted on the socket body and provided with a plurality of electro-conducting members. The contact unit including a unit body vertically movable with respect to the socket body, the unit body being provided with the electro-conducting member which comprises an upper contact portion to be contacted with a terminal of the electrical part accommodated on the unit body and a lower contact portion to be contacted with an electrode portion of the wiring board. A contact pressure between the upper contact portion and the terminal of the electrical part is designed to be equal to a contact pressure between the lower contact portion and the electrode of the wiring board.

13 Claims, 10 Drawing Sheets

PRIOR ART

PRIOR ART

PRIOR ART

PRIOR ART

SOCKET FOR ELECTRICAL PARTS

BACKGROUND OF THE INVENTION

1. Field of the Invention

The present invention relates to a socket for an electrical part for detachably accommodating electrical parts such as semiconductor devices (called "IC package" hereinafter), to establish an electrical connection between the electrical part and a wiring board.

2. Prior Art of the Invention

In conventional art, an IC socket has been known as a "socket for an electrical part" of this kind for detachably accommodating, for example, an IC package as an "electrical part." And one of the examples of this kind of the IC socket is shown in FIGS. 7 to 10.

The conventional IC socket 1 has a socket body 3 to be mounted on a wiring board 2, and a contact unit 5 which is fixed to the socket body 3 and is provided with a plurality of contact pins 4.

The contact unit 5 has a unit body 7 fixed to the socket body 3 by an attachment member 8, and the contact pins 4 are provided to the unit body 7.

The contact pin 4 (details are not shown) has an upper contact portion 4a designed to contact with a solder ball 6b as a terminal of the IC package 6 accommodated on the unit body 3 and a lower contact portion 4b designed to contact with an electrode portion 2a of a wiring board 2. Between both contact portions 4a, 4b, a spring member (not shown) that urges both contact portions 4a and 4b so as to move them away from each other is arranged.

A contact pressure between the upper contact portion 4a and the solder ball 6b is designed to be equal to a contact pressure between the lower contact portion 4b and the electrode portion 2a of the wiring board.

In such IC socket 1, as shown in FIGS. 7 and 8 in which the socket body 3 is attached to the wiring board 2 and secured by a screw 10, the IC package 6 is first accommodated on the unit body 7, a cover member 9 pushes the IC package 6 as seen from the state shown in FIG. 7 to the state shown in FIG. 8, so that the contact pin 4 is compressed, and then the downward displacement of the IC package 6 is stopped when the IC package 6 abuts on the unit body 7.

At this time the contact pin 4 is compressed against the urging force of the spring member, and the reaction force in response to the amount of the compression acts on both contact portions 4a and 4b, thereby establishing electrical contacts with equal contact pressure on both the contacts between the upper contact portion 4a and the solder ball 6b of the IC package 6 and between the lower contact portion 4b and the electrode portion 2a of the wiring board 2.

The socket of this kind is disclosed in, for example, WO 01/037381.

In such conventional socket, however, a gap or distance C1 as shown in FIGS. 7 and 8 is set up, in consideration of a difference or dispersion in the thickness of the unit body 7, between the unit body 7 and the wiring board 2 in the case where the unit body 7 is fixed to the socket body 3, or a gap or distance C2 as shown in FIGS. 9 and 10 is set up between the socket body 3 and the wiring board 2 at the stage where the unit body 7 abuts on the wiring board 2.

In the former case shown in FIGS. 7 and 8, even when the contact pin 4 is compressed to the maximum limit, the contact pin 4 can not be compressed beyond the distance of C1. Therefore, the amount of compression of the contact pin 4 becomes small, causing decrease in contact pressure of the contact portion 4a or 4b with respect to the solder ball 6b of the IC package 6 or the electrode portion 2a of the wiring board 2.

On the other hand, in the latter case shown in FIGS. 9 and 10, when the contact pin 4 is compressed to the maximum limit, the contact pressure of the contact portion 4a or 4b with respect to the solder ball 6b of the IC package 6 or the electrode portion 2a of the wiring board 2 can be increased more than the case of FIGS. 7 and 8. However, warping could be occurred in the socket body 3 or the wiring board 2 when the socket body 3 is fixed to the wiring board 2 by the screw 10 because of the presence of the distance C2 between the socket body 3 and the wiring board 2.

SUMMARY OF THE INVENTION

An object of the present invention is to substantially eliminate defects or drawbacks encountered in the prior art reference mentioned above and to provide a socket for electrical parts capable of preventing a contact unit or a wiring board from warping as well as capable of ensuring contact pressure between contact portions of the contact pin and terminals of the electrical part and electrodes of the wiring board respectively.

This and other objects can be achieved according to the present invention by providing a socket for an electrical part comprising:

a socket body to be mounted on a wiring board and a contact unit mounted on the socket body and provided with a plurality of electro-conducting members, the contact unit including a unit body vertically movable with respect to the socket body, the unit body being provided with the electro-conducting member which comprises;

an upper contact portion to be contacted with a terminal of the electrical part accommodated on the unit body, and a lower contact portion to be contacted with an electrode portion of the wiring board, a contact pressure between the upper contact portion and the terminal of the electrical part is designed to be equal to a contact pressure between the lower contact portion and the electrode of the wiring board.

In another preferred embodiment of the present invention, the electro-conducting member comprising a vertically movable upper and lower contact portions, both of which are urged toward the direction away from each other by a spring member.

In still another preferred embodiment of the present invention, the socket is further provided with an urging means between the socket body and the unit body for urging the unit body downward.

According to the present invention, since the unit body of the contact unit, which is provided with a plurality of electro-conducting member, is vertically movable with respect to the socket body, even where there is a dispersion or difference in thickness of the unit body, the unit body can be surely contacted with the wiring board by vertical displacement of the unit body under a situation where the socket body is abutted on and fixed to the wiring board. The electro-conducting member can be compressed to the maximum limit without occurrence of warping of the wiring board or the contact unit, and the contact pressure of both contact portions of the electro-conducting member with respect to the terminal of the electrical part and the electrode of the wiring board can be ensured.

In the preferred embodiments mentioned above of the present invention, the urging means for urging downward the unit body is provided between the socket body and the unit body so that a pushing pressure on the electrical part by other member can be reduced, and unstable or wobbling movement of the unit body with respect to the socket body can be prevented because the unit body is always press-contacted to the wiring board.

The nature and further characteristic features of the present invention will be made more clear from the following descriptions made with reference to the accompanying drawings.

DESCRIPTION OF THE PREFERRED EMBODIMENTS

First Embodiment

Figure 1:
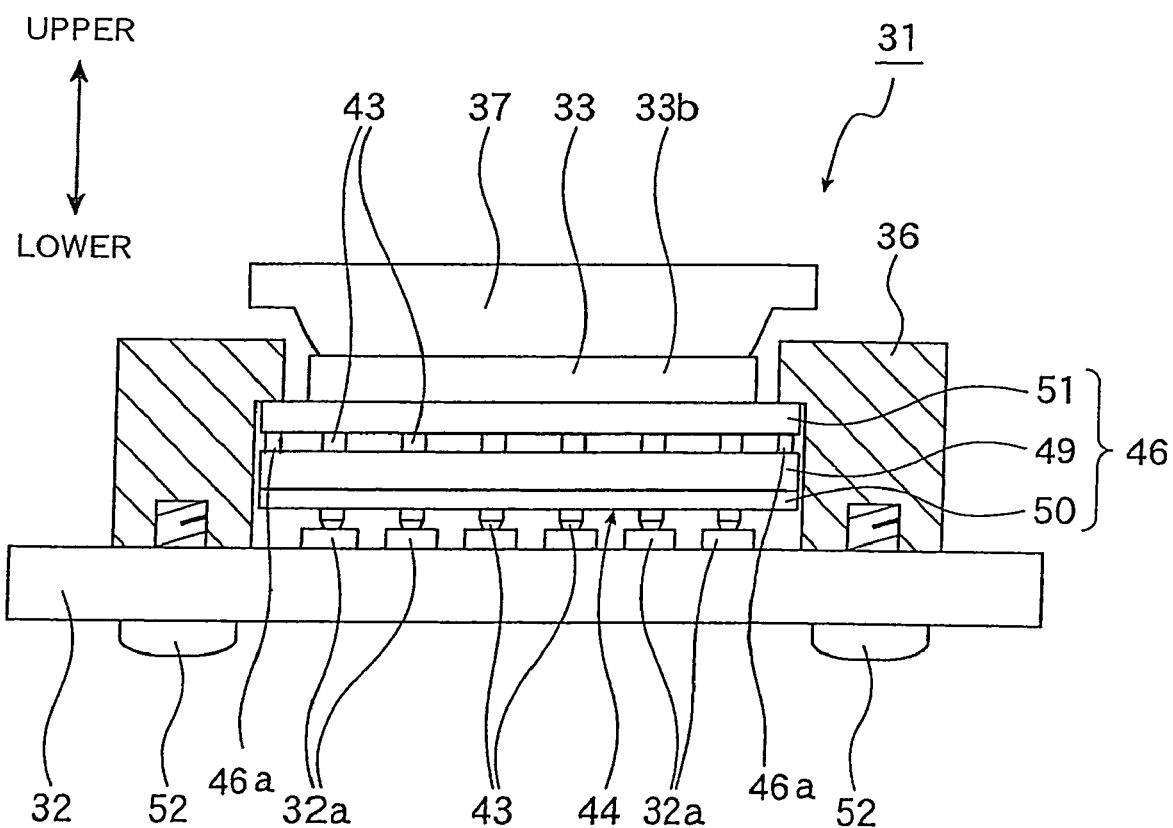
FIG. 1 is a schematic view of an IC socket, in which an IC package is not yet depressed, according to a first embodiment of the present invention.

FIGS. 1 to 4 represent a first embodiment of the present invention.

In FIGS. 1 to 9, reference numeral 31 denotes an IC socket as a "socket for an electrical part", and an IC package 33 as the "electrical part" is held on the IC socket 31 so as to establish an electrical connection to a wiring board 32.

This type of IC package 33 is referred to as what is called a BGA (Ball Grid Array) type having a structure in which a plurality of solder balls 33a as "terminals", with each of them having substantially spherical shape, are arranged, in a matrix manner with rows and columns, on the lower surface of a package body 33b having, for example, a square shape.

The IC socket 31 has a socket body 36 attached using a screw 52 to a wiring board 32 and a contact unit 44 arranged to the socket body 36 and provided with a plurality of contact pins 43.

The contact unit 44 has a unit body 46 arranged to be vertically movable with limitation of movement in a horizontal direction with respect to the socket body 36. The contact pin 43 as an "electro-conducting member" is arranged in the unit body 46.

Figure 2:
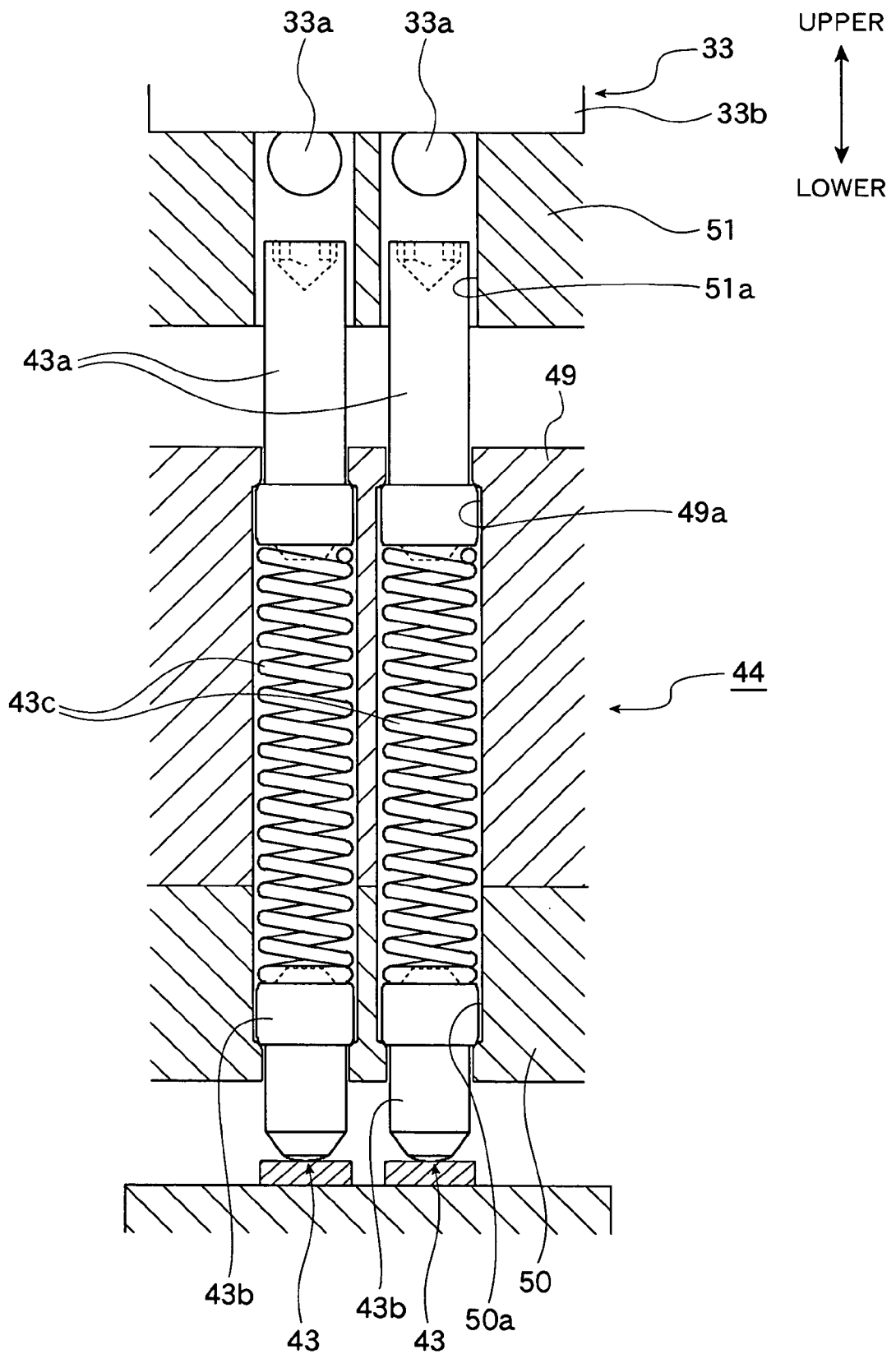
FIG. 2 is an enlarged sectional view of an arrangement portion of a contact pin of the IC socket according to the first embodiment.

As shown in FIG. 2, the contact unit 44 has an upper holding member 49 and a lower holding member 50, both of them being attached to each other by bolts (not shown) and having a holding opening 49a, 50a into which the contact pin 43 is inserted and held.

On the upper side of the upper holding member 49, a floating plate 51 is arranged to be vertically movable (structure is not shown) and is designed to be stopped at a predetermined upper height, and is urged upward by a spring 46a.

The floating plate 51 has an insertion opening 51a into which an upper portion of the contact pin 43 is inserted and further the floating plate 51 has a guide portion (not shown) for guiding the IC package 33 when the IC package is accommodated on the socket.

The contact pin 43, respective parts of which is formed of electro-conducting material, has an upper contact portion 43a, at an upper portion thereof, to contact with the solder ball 33a of the IC package 33, a lower contact portion 43b, at a lower portion thereof, to contact with an electrode portion 32a of the wiring board 32, and a coil spring 43c as a "spring member" arranged between the upper contact portion 43a and the lower contact portion 43b for urging these contact portions 43a, 43b so as to move them away from each other. Further, as shown in FIG. 2, an upper end surface (contact surface) of the upper contact portion 43a is shaped to be concave in order to prevent the lowermost end portion of the solder ball 33a from contacting with the upper contact portion.

The socket body 36 is rotatably provided with a cover member 37 which is urged by a spring (not shown) in an opening direction. The cover member 37 is designed to press the IC package 33.

Next, operation of the socket will be explained.

At first, accommodation of the IC package 33 will be explained. The IC package 33 is conveyed and accommodated on the floating plate 51 using automated machines, etc. when the cover member 37 is in an opening state. At this time, the IC package 33 is guided by the guide member thereby to be accommodated on a predetermined position, and the solder ball 33a is inserted into the insertion opening 51a of the floating plate 51 as shown in FIG. 2.

From this state, the cover member 37 is gradually closed and the IC package 33 is depressed by the cover member 37. Then the floating plane 51 is depressed against urging force of the spring 46a, and then the solder ball 33a is contacted with the upper contact portion 43a of the contact pin 43. Thereby, the upper contact portion 43a is displaced downward against urging force of the coil spring 43c.

Figure 3:
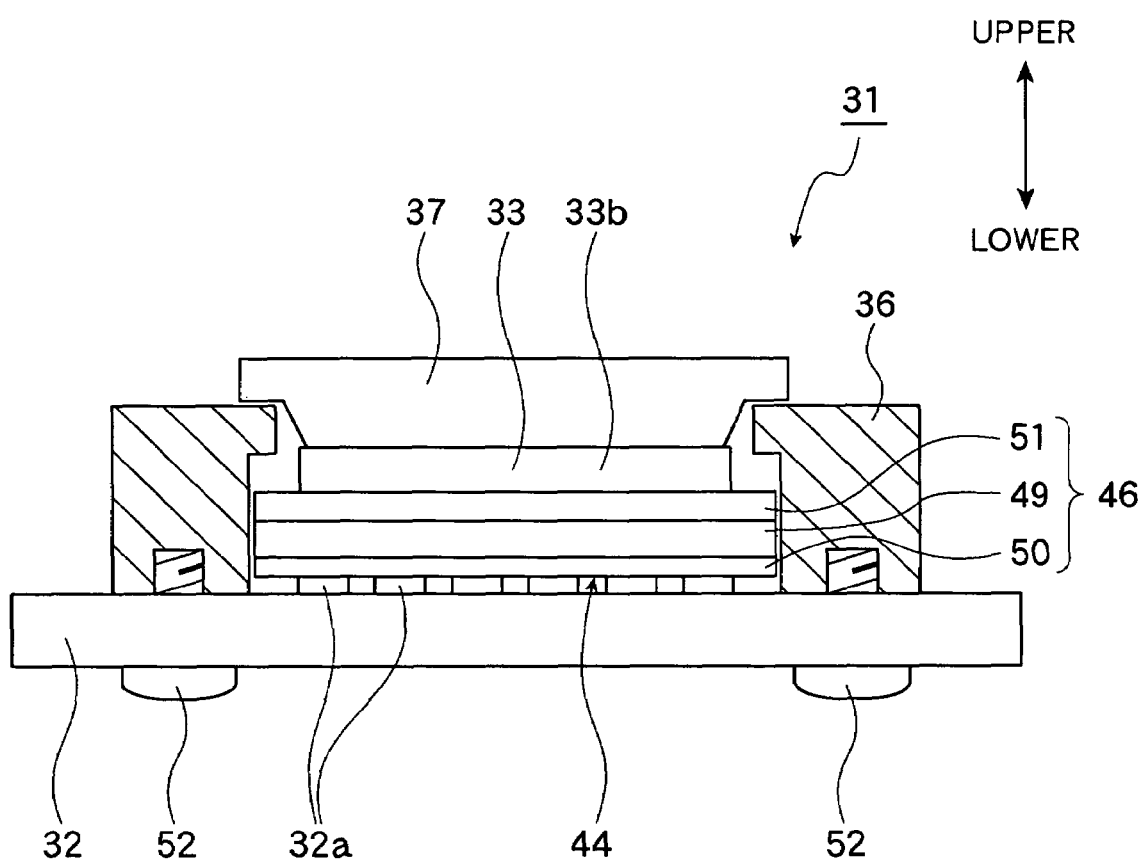
FIG. 3 is a schematic view of the IC socket in which the IC package is depressed from the state shown in FIG. 1 of the first embodiment.
Figure 4:
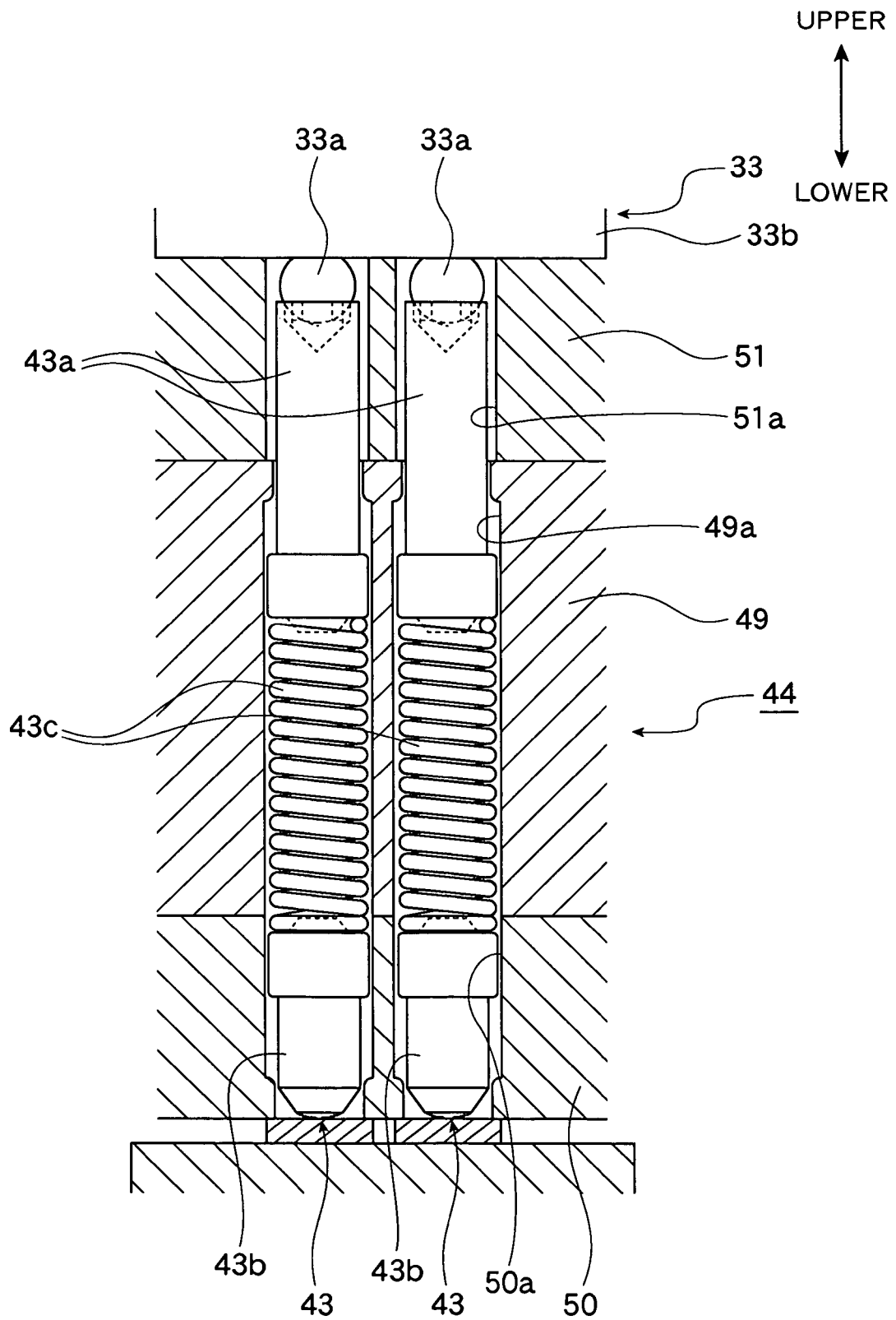
FIG. 4 is an enlarged sectional view in which the IC package is depressed from the state shown in FIG. 2 of the first embodiment.

When the floating plate 51 is further depressed to abut on an upper surface of the upper holding member 49, so that the unit body 46 is lowered as a whole until a lower surface of the lower holding member 50 abuts on the electrode 32a of the wiring board 32 (see FIGS. 3 and 4).

According to the operation mentioned above, the contact pin 43 is compressed against the urging force of the coil spring 43c so that reactive force generated by the compression not only brings the upper contact portion 43a into contact with the solder ball 33a of the IC package 33 but also brings the lower contact portions 43b into contact with the electrode 32a of the wiring board 32 with equal contact pressure on both the upper and lower contact portions.

Thus electrical connection is established between the IC package 33 and the wiring board 32 through the contact pin 43, and then burn in test, etc., is carried out.

In a socket of this type, since the unit body 46 is arranged vertically movable, the unit body 46 can be lowered, at the time of accommodating the IC package 33, to the maximum limit up until abutting on the wiring board 32, being able to make the amount of compression of the contact pin 43 larger. Accordingly, contact pressure of the contact portions 43a, 43b with respect to the solder ball 33a of the IC package 33 and the electrode portion 32a of the wiring board 32 can be ensured by the reaction force of the contact pin 43.

Further, since the unit body 46 is vertically movable, even where there is a difference or dispersion in thickness of the unit body 46, the socket body 36 can be fixed to the wiring board 36 by using the screw 52 without creating a gap or distance between the socket body 36 and the wiring board 32.

Accordingly, no warping phenomenon occurs in the wiring board 32 or in the socket body 36 in the present invention, being different from the conventional socket.

Second Embodiment

Figure 5:
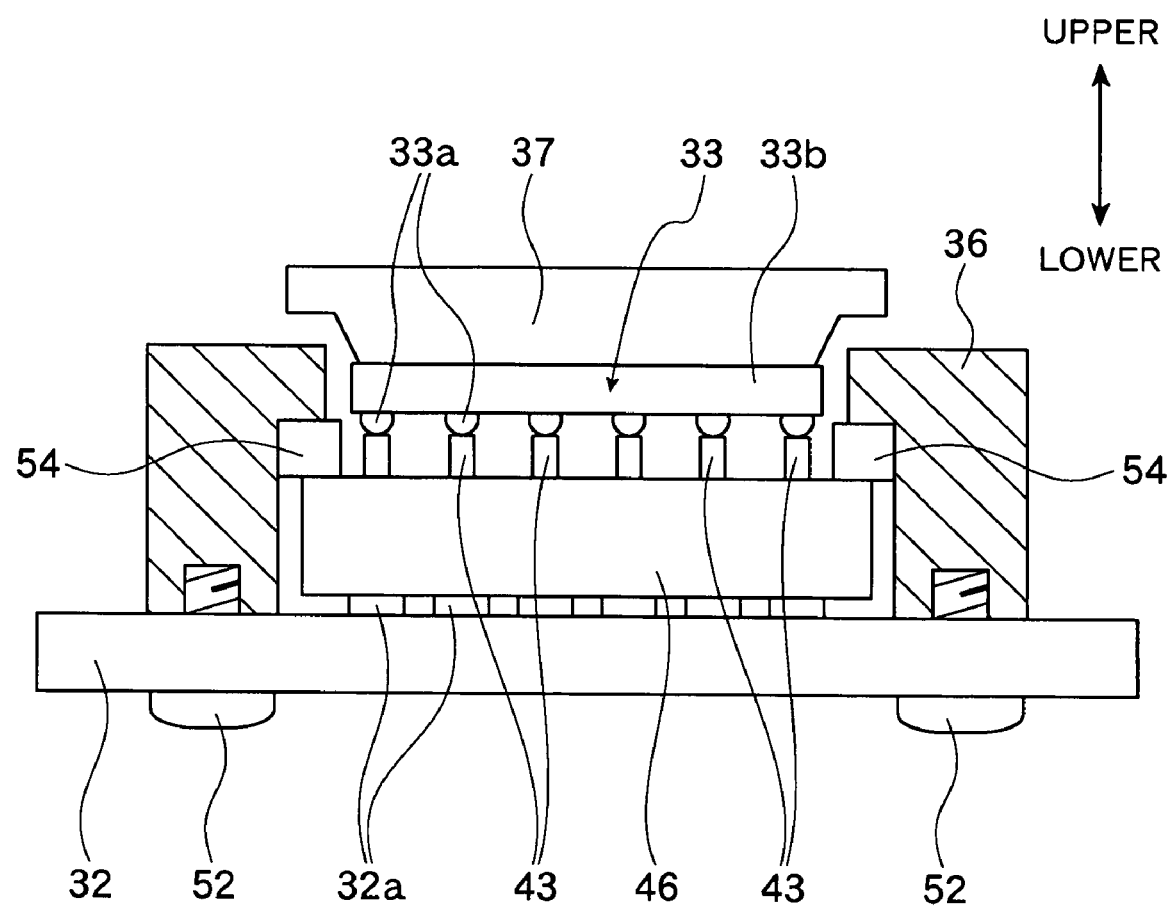
FIG. 5 is a schematic view corresponding to FIG. 1 according to a second embodiment of the present invention.

FIG. 5 represents the second embodiment of the present invention.

In this second embodiment, when compared with the first embodiment, the unit body 46 of the contact unit 44 is composed only of the upper holding member 49 and the lower holding member 50 and has no floating plate 51.

An elastic member 54 such as rubber material or the like is used as "urging means" between the unit body 46 and the socket body 36. The unit body 46 is urged downward by the elastic member 54 so that the unit body 46 is designed to abut on the wiring board 32.

In the socket of this kind, since the unit body 46 is urged downward by the elastic member 54, depressing force to be applied on the IC package 33 by the cover member 37 can be designed to be smaller. Further, the unit body 46 is structured to constantly contact with the wiring board 32 so that an unstable or wobbling movement of the unit body 46 with respect to the socket body 36 can be prevented.

Further, it is to be noted that since the structure and function of the second embodiment other than those mentioned above are substantially the same as those of the first embodiment, the explanation thereof are omitted herein.

Third Embodiment

Figure 6A:
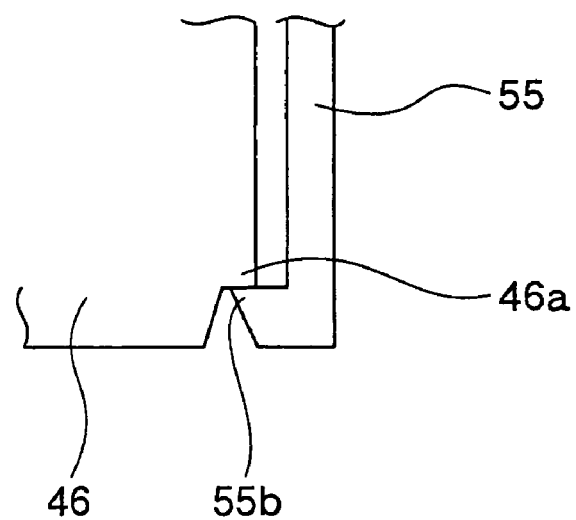
FIGS. 6A and 6B are schematic views of a third embodiment of the present invention in which a contact unit is in an engaging state.
Figure 6B:
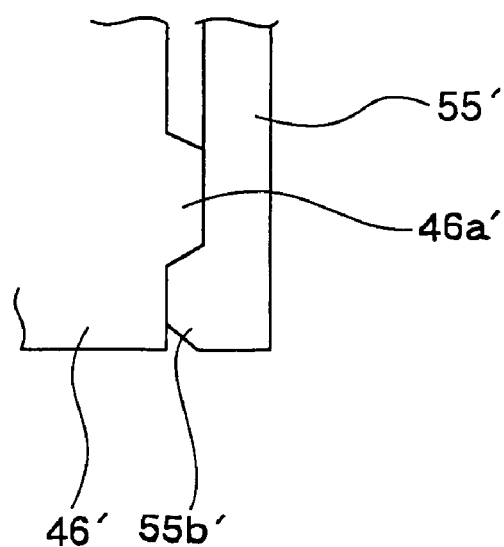
Figure 7:
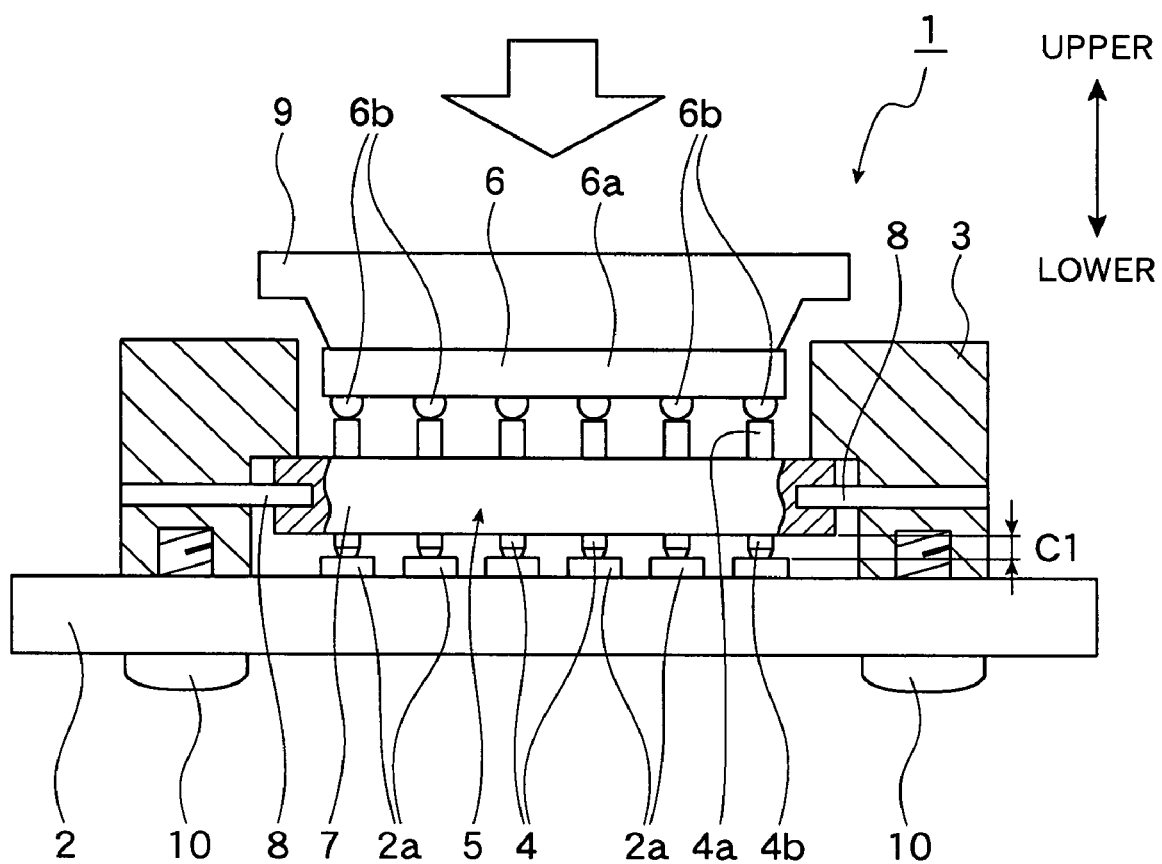
FIG. 7 is a schematic view corresponding to FIG. 1, in which the IC package is not yet depressed and a socket body is in a contacting state with the wiring board according to conventional art.
Figure 8:
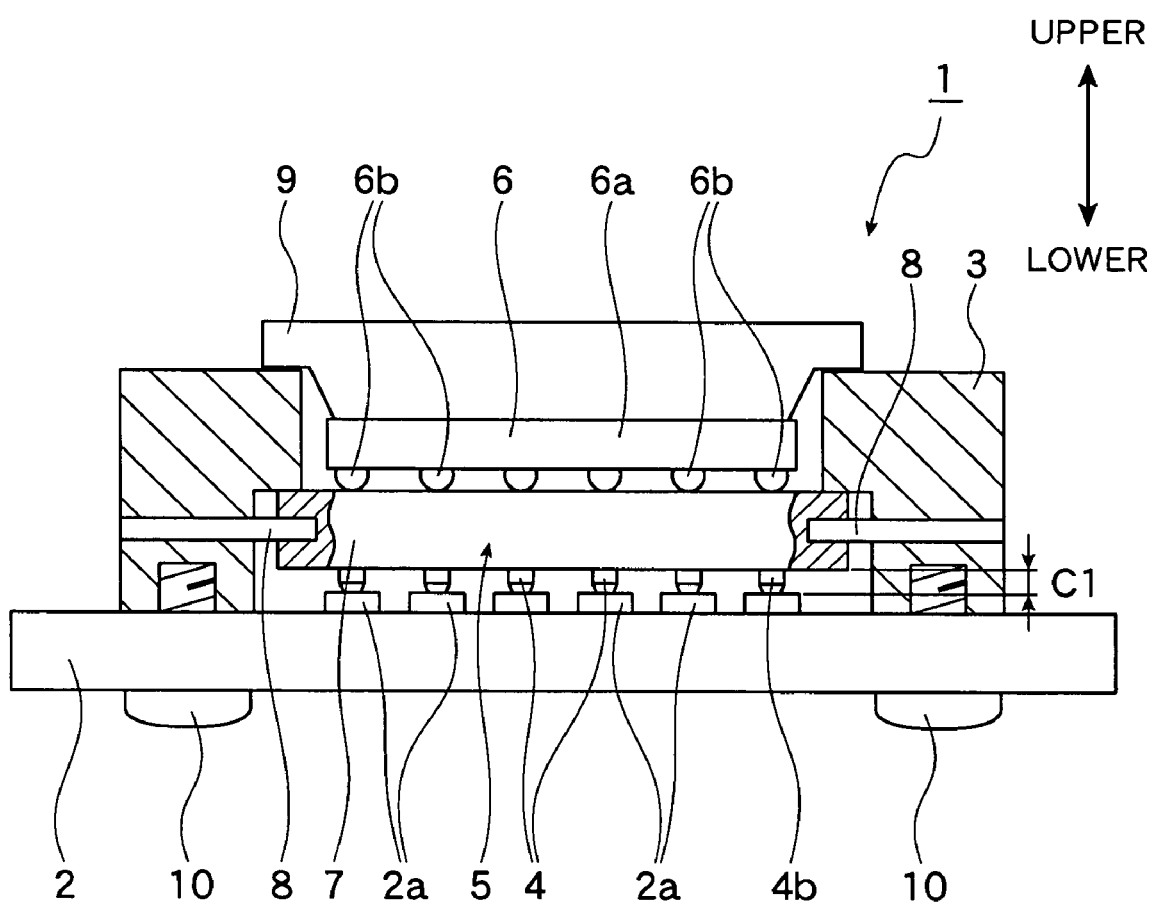
FIG. 8 is a schematic view after the IC package is depressed from the state shown in FIG. 7.
Figure 9:
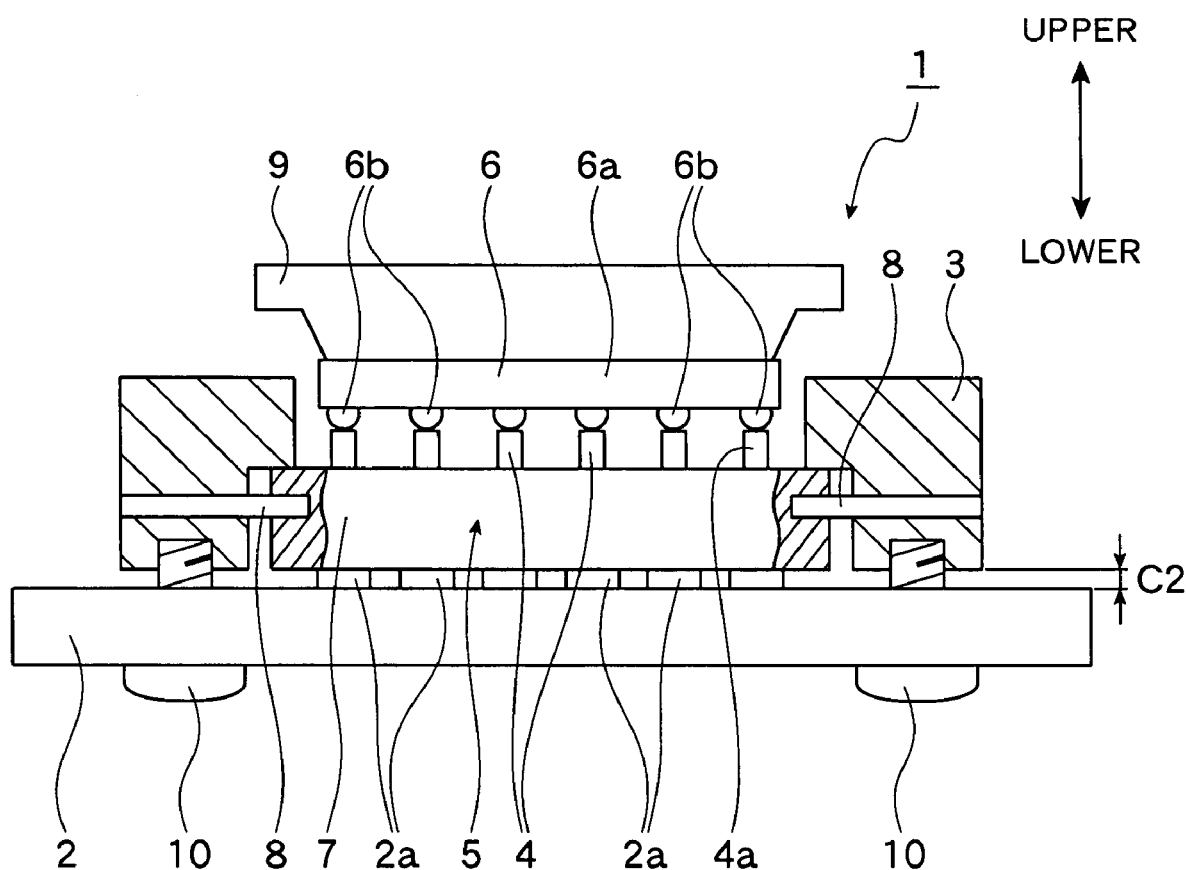
FIG. 9 is a schematic view, corresponding to FIG. 1, of the socket body according to the conventional art, in which the IC package is not yet depressed and the socket body is floated over or staying up from the wiring board.
Figure 10:
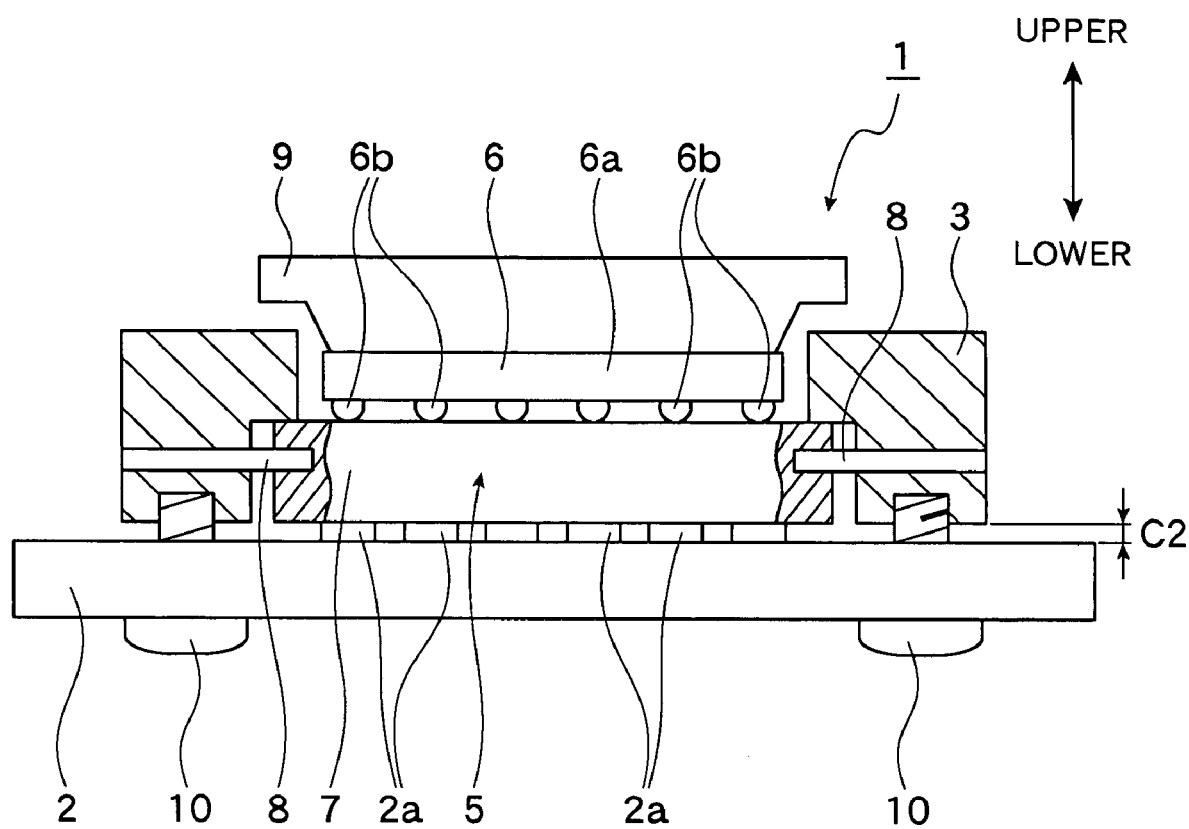
FIG. 10 is a schematic view of a state after the IC package is depressed from the state shown in FIG. 9.

FIGS. 6A and 6B represent the third embodiment of the present invention.

In the third embodiment, as shown in FIGS. 6A and 6B, an engaging piece 55 or 55' is formed on the side of the socket body 36. The engaging piece 55 or 5' has an engaging projection 55b or 55b' to be engaged with an engaged portion 46a or 46a' of the unit body 46 or 46', and then the unit body 46 or 46' can be held by the socket body 36. In this state, the unit body 46 or 46' is arranged to be vertically movable with respect to the socket body 36.

Since the unit body 46 or 46' is held by the socket body 36 to be vertically movable by the engaging piece 55 or 55', easy handling can be realized when the IC socket 31 is mounted on and fixed to the wiring board 32.

It is to be noted that since the structure and function of the third embodiment other than those mentioned above are substantially the same as those of the first embodiment, the explanations thereof are omitted here.

For example, in the described embodiments, although the present invention is applied to the IC socket 31 for the BGA-type IC package 33, the present invention is not limited to that and also applicable to an IC socket for, for example, an LGA (L and Grid Array)-type and a PGA (Pin Grid Array)-type IC packages whose terminals are arranged on an under surface of the IC packages or an IC package such as a QFP (Quad Flat Package)-type, etc., whose terminals are extended from the side of the IC package.

Further, the socket for an electrical part of the present invention is also applicable to an open-top type IC socket or to a socket whose pusher for pushing the electrical part is arranged on an automated machine.

Still further, the contact pins of the present invention is not limited to the embodiments described above and is applicable to any type of contact pins as long as same contact pressure acts on both contact portions.

What is claimed is:

1. A socket for an electrical part, comprising:
a wiring board on which a plurality of electrodes are arranged;
a plurality of electro-conducting members which are vertically telescopic;
a unit body comprising:
a holding member which holds the electro-conducting members such that upper contact portions and lower contact portions of the electro-conducting members project out, the holding member being vertically movable on the wiring board so that the lower contact portions of the electro-conducting members contact to the electrodes of the wiring board; and
a floating plate that is vertically movable above the holding member and has through holes through which the upper contact portions of the electrode-conducting members pierce;
a socket body that is fixed on the wiring board and has an inside surface adjacent to the unit body;
an urge member which is placed between the floating plate and the holding member, and urges the floating plate upward; and
a cover member which pushes down the holding member and floating plate by pushing the electrical part downward at a stronger force than the urge member when the electrical part is placed on the upper contact portions of the electro-conducting members,
wherein contact pressures between the lower contact portions and the electrodes of the wiring board are the same as contact pressures between the upper contact portions and the electrical part.

2. The socket for an electrical part according to claim 1, wherein the upper and lower contact portions are vertically movable, both of which are urged toward a direction away from each other by a spring member.

3. The socket for an electrical part according to claim 1, wherein said one of the electro-conducting members is movable with respect to the unit body.

4. The socket for an electrical part according to claim 1, further comprising a pusher member designed to push the electrical part accommodated on the unit body.

5. The socket for an electrical part according to claim 1, wherein the socket body has a ledge which contacts to an upper surface of the floating plate for holding the floating plate and the holding member by urging of the urge member.

6. The socket for an electrical part according to claim 1, wherein the cover member pushes down the holding member and floating plate until the holding member contacts to the wiring board.

7. The socket for an electrical part according to claim 1, wherein one of the electro-conducting members comprises a spring which vertically urges the upper contact portion and the lower contact portion.

8. The socket for an electrical part according to claim 1, further comprising an engaging piece formed on a side of the socket body and an engaged portion formed on a side of the unit body such that the unit body is held by the socket body.

9. The socket for an electrical part according to claim 8, wherein the engaging piece comprises an engaging projection to be engaged with the engaged portion such that the unit body is held by the socket body, and vertically movable with respect to the socket body.

10. The socket for an electrical part according to claim 1, wherein the holding member comprises an upper holding member and a lower holding member attached to each other.

11. The socket for an electrical part according to claim 10, wherein the upper and lower holding members each comprise a holding opening into which said one of the electro-conducting members is inserted and held.

12. The socket for an electrical part according to claim 10, wherein the upper holding member and the lower holding member are detached from each other, which thereby allows the plurality of electro-conducting members to be removed from the unit body.

13. A socket for an electrical part, comprising:
- a wiring board on which a plurality of electrodes are arranged;
- a plurality of electro-conducting members which are vertically telescopic;
- a unit body comprising:
  - a holding member which holds the electro-conducting members such that corresponding upper contact portions and corresponding lower contact portions of the electro-conducting members project out, the holding member being vertically movable on the wiring board so that the lower contact portions of the electro-conducting members contact to corresponding electrodes of the wiring board; and
  - a floating plate that is vertically movable above the holding member and that has through holes through which corresponding upper contact portions of the electrode-conducting members pierce;
- a socket body that is fixed on the wiring board and has an inside surface adjacent to the unit body;
- an urge member which is placed between the floating plate and the holding member, and urges the floating plate upward; and
- a cover member which pushes down the holding member and floating plate by pushing the electrical part downward at a stronger force than the urge member when corresponding terminals of the electrical part are placed on the respective upper contact portions of the electro-conducting members, wherein contact pressures between the lower contact portions and the corresponding electrodes of the wiring board are the same as contact pressures between the upper contact portions and corresponding terminals of the electrical part.

* * * * *